United States Patent
Lee et al.

(10) Patent No.: US 6,559,699 B2
(45) Date of Patent: May 6, 2003

(54) DUAL CONTROL ANALOG DELAY ELEMENT

(75) Inventors: Ki-Jun Lee, Nepean (CA); Gurpreet Bhullar, Nepean (CA)

(73) Assignee: Mosaid Technologies Inc., Kanata (CA)

(*) Notice: Subject to any disclaimer, the term of this patent is extended or adjusted under 35 U.S.C. 154(b) by 0 days.

(21) Appl. No.: 09/985,972

(22) Filed: Nov. 7, 2001

(65) Prior Publication Data

US 2002/0027464 A1 Mar. 7, 2002

Related U.S. Application Data

(63) Continuation of application No. 09/514,273, filed on Feb. 28, 2000.

(30) Foreign Application Priority Data

Feb. 26, 1999 (CA) .............................................. 2263061

(51) Int. Cl.[7] .............................................. H03H 11/26
(52) U.S. Cl. ..................... 327/276; 327/269; 327/270
(58) Field of Search .............................. 327/158, 159, 327/161, 284, 269, 270, 276, 287, 534, 535, 536, 537

(56) References Cited

U.S. PATENT DOCUMENTS

| | | | | |
|---|---|---|---|---|
| 4,633,152 A | * | 12/1986 | Farr ........................... 318/257 |
| 5,345,449 A | | 9/1994 | Buckingham et al. ... 370/100.1 |
| 5,495,161 A | * | 2/1996 | Hunter ........................ 318/807 |
| 5,570,243 A | * | 10/1996 | Mattison ....................... 360/51 |
| 5,589,788 A | | 12/1996 | Goto ........................... 327/276 |
| 5,650,739 A | | 7/1997 | Hui et al. .................... 327/262 |
| 5,801,570 A | * | 9/1998 | Mizuno et al. ............. 327/362 |
| 6,046,627 A | * | 4/2000 | Itoh et al. ................... 327/546 |
| 6,101,106 A | * | 8/2000 | Shi .............................. 364/41 |

FOREIGN PATENT DOCUMENTS

| | | |
|---|---|---|
| EP | 0 087 707 A2 | 2/1983 |
| EP | 0 712 204 A2 | 10/1995 |

OTHER PUBLICATIONS

Patent Abstracts of Japan vol. 016, No. 112 (E–1180), Mar. 19, 1992 & JP 03 283912 A (Advantest Corp.) Dec. 13, 1991 abstract.

* cited by examiner

*Primary Examiner*—Tuan T. Lam
*Assistant Examiner*—Hiep Nguyen
(74) *Attorney, Agent, or Firm*—Shapiro Cohen; Dennis R. Haszko; Harold C. Baker

(57) ABSTRACT

A delay line comprised of analog delay elements each having a selectively adjusted coarse and fine delay portion is described. The coarse delay portion receives an input clock signal and generates a ramp signal having a slope based on a predetermined coarse delay setting. The fine delay portion generates a threshold voltage based on a predetermined fine delay setting. A comparator compares the coarse delay ramp signal voltage with the fine delay threshold voltage and generates an output clock signal when the ramp signal voltage surpasses the fine delay threshold voltage. The coarse delay is linearly adjustable based on a 32-bit binary input signal and the fine delay is binary-weight adjusted based on a 5-bit binary input signal. Both the coarse and fine delay portions are controlled by delay line control circuitry which compares a feedback version of the output clock signal with the input clock signal and provides control signals to increment or decrement coarse and fine delay in the delay line.

5 Claims, 9 Drawing Sheets

DUAL CONTROL ANALOG DELAY ELEMENT

This application is a continuation application of U.S. Ser. No. 09/514,273 filed Feb. 28, 2000.

FIELD OF THE INVENTION

This invention relates to the field of delay locked loops, and in particular to a novel delay element.

BACKGROUND TO THE INVENTION

Delay locked loops are used to control the timing of an internal clock signal, to match that of an input or external clock signal. Typically an external clock signal is passed through a delay line, where the external clock signal is delayed for a controllable time. The output signal of the delay line is applied to a circuit to be clocked via a clock distribution tree. One of the clock signals from the distribution tree (the internal clock signal) is applied with the external clock to a comparator, which determines any phase difference. The difference is used to generate delay line control signals, which are applied to the delay line so as to cause the delay to vary and thus minimize any phase difference between the external clock signal and the internal clock signal.

Typically the delay line is formed of coarse delay elements and one or more fine delay elements. One or more coarse delay elements are connected in series with a fine delay element. The fine delay element can be adjusted to the maximum time delay of one coarse delay element. A system which uses this structure is described in U.S. patent application Ser. No. 09/106,755 filed Jun. 30, 1998, and entitled "Process, Voltage and Temperature Independent Switched Delay Compensation Scheme", invented by Gurpreet Bhullar et al, which is incorporated herein by reference.

In delay lines of this type, plural inverters are connected in series between an input for receiving the input clock and an output. Switches controlled by the delay line control are switched so as to bypass various ones of the inverters, and thus control how many inverters the external clock signal has to pass through.

However, it has been found that since even the fine delay is controlled in steps, there is some jitter remaining. This is because in attempting to maintain the DLL setting about a lock point, the DLL control circuitry may attempt to add and remove one fine delay element continuously. If one fine control step does not set the delay to cause the internal clock signal to be exactly in phase with the external clock, there will be jitter about the lock point.

It has also been found that the fine delay line cannot always compensate for one coarse delay element since the coarse element delay can have a longer delay than the maximum that can be provided by the dynamic range of the fine delay control due to temperature and voltage conditions.

It has also been found that noise on the power supply rails can cause jitter in the output signal of the delay line, especially in the case of RC-based inverter delay lines.

The digital delay line also takes up significant integrated circuit area, due to the resistors and capacitors required to provide the digital delay line.

It is also desirable to have as large a dynamic range as possible. This dynamic range is limited in a delay line having fixed coarse and fine delay elements. Furthermore, each delay element of the delay line will experience large variation of delay with variations in temperature and voltage.

SUMMARY OF THE INVENTION

The present invention has several advantages over the digital delay line described above. In a comparison between the above described digital delay line, in a prototype which had five delay elements to provide a certain delay variation, only two elements were required using the present invention to achieve approximately the same dynamic range. Thus there is substantial improvement in dynamic range of each element.

The present invention also takes up smaller integrated circuit chip area than the above-described digital delay line, for approximately the same delay, since plural resistors and capacitors are not required.

The dynamic range increases with decreasing frequency in the present invention, which is the opposite of that of the digital delay line, for which more and more elements would be required to make up the increased delay time that would be required in a low frequency device and for test purposes.

The control voltages used in the present invention can be made very accurate and immune to temperature and voltage variations. The delay is thus substantially immune to process variations.

The present invention uses analog delay elements, instead of digital delay elements of the prior art.

In accordance with an embodiment of the present invention, a delay line for receiving an input clock signal and internally delaying the input clock signal to produce an output clock signal, the delay line comprising: a plurality of analog delay elements, each analog delay element having a first delay adjustment input and a second delay adjustment input, a first bias voltage generator for providing a first bias voltage to the first delay adjustment input of each analog delay element, a second bias voltage generator for providing a second bias voltage to the second delay adjustment input of each analog delay element, a delay line control circuit for controlling the first and second voltage bias generators in response to a phase comparison between the output clock signal and the input clock signal, and a third bias voltage generator for providing a third bias voltage as an input to both the first and second bias voltage generators.

In accordance with another embodiment, a method for delaying a clock signal through a delay line having a plurality of delay elements comprising the following steps: receiving a digital input clock signal first edge, generating a first ramp voltage at a first node in response to the presence of the clock signal first edge, the ramp voltage having a slope which is dependent on a current which is controlled by a bias voltage, said bias voltage being generated based on a counter output, generating an output voltage first edge at a second node in response to a comparison between the first ramp voltage and a predetermined voltage level, generating a digital output clock signal first edge in response to the output voltage first edge at the second node, receiving a second edge of the digital input clock signal, and generating a digital output clock signal second edge in response to second edge of the digital input clock.

In accordance with another embodiment, a method of delaying an input clock signal comprising: receiving a digital clock signal, applying the digital clock signal to an analog delay element having both coarse and fine delay control inputs, applying both coarse and fine delay control signals to the respective coarse and fine delay control inputs for controlling an amount of fine and coarse delay through the delay element, said coarse and fine delay control signals being generated based on an output from a coarse delay counter and on an output from a fine delay counter respectively, and outputting a digital clock signal delayed from the input clock signal by an amount equal to the sum of the fine and coarse delays through the delay element.

BRIEF DESCRIPTION OF THE DRAWINGS

A better understanding of the invention will be obtained by a consideration of the detailed description below, in conjunction with the following drawings, in which.

DETAILED DESCRIPTION OF PREFERRED EMBODIMENTS

Figure 1A:
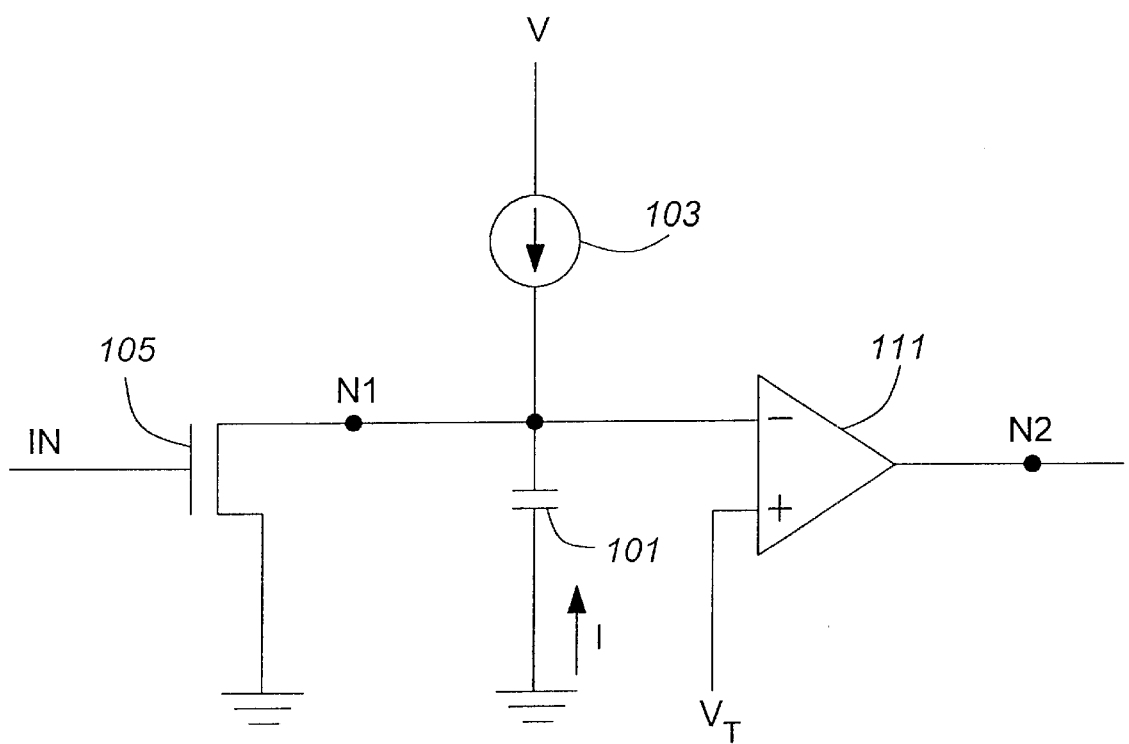
FIG. 1A is a block diagram of a delay element of the present invention in its most basic form.
Figure 1B:
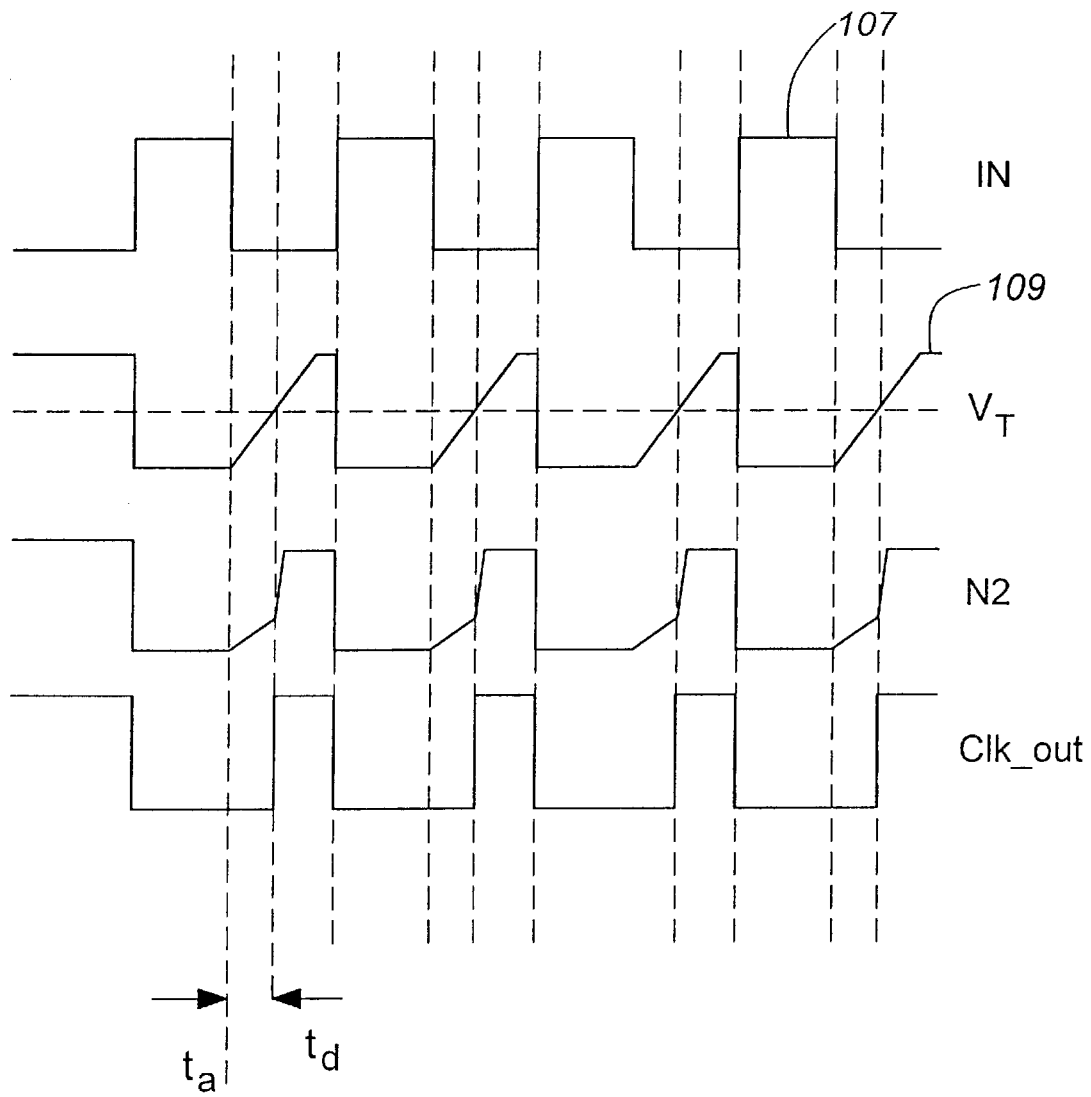
FIG. 1B illustrates waveforms that may be observed in the circuit of FIG. 1A.

With reference to FIGS. 1A and 1B, a capacitor 101 is connected in series with a constant current source 103, node N1 forming their junction. Capacitor 101 can be implemented by using the intrinsic capacitance of node N1 which includes the input capacitance of a comparator 111 which is also connected to node N1. The source-drain circuit of a field effect transistor (FET) 105 is connected in parallel with the capacitor. An external clock signal IN is applied to the gate of the field effect transistor (FET) 105, shown in FIG. 1B as the signal 107.

The capacitor will charge substantially linearly as long as the FET 105 is nonconductive. For the n-channel type FET shown, while the external clock signal is at low logic level, the source-drain circuit of the FET will be nonconductive. While the external clock signal is at high logic level, the source-drain circuit of FET 105 will be conductive, discharging capacitor 101. The result is that a continuous ramp signal is generated on every clock cycle, shown in FIG. 1B as signal 109. The signal 109 is applied from node N1 to one input of a comparator 111, which has a reference voltage $V_T$ applied to its other input. As shown in FIG. 1B, the voltage at node N1 surpasses $V_T$ as the ramp increases at a time $t_d$.

Figure 2:
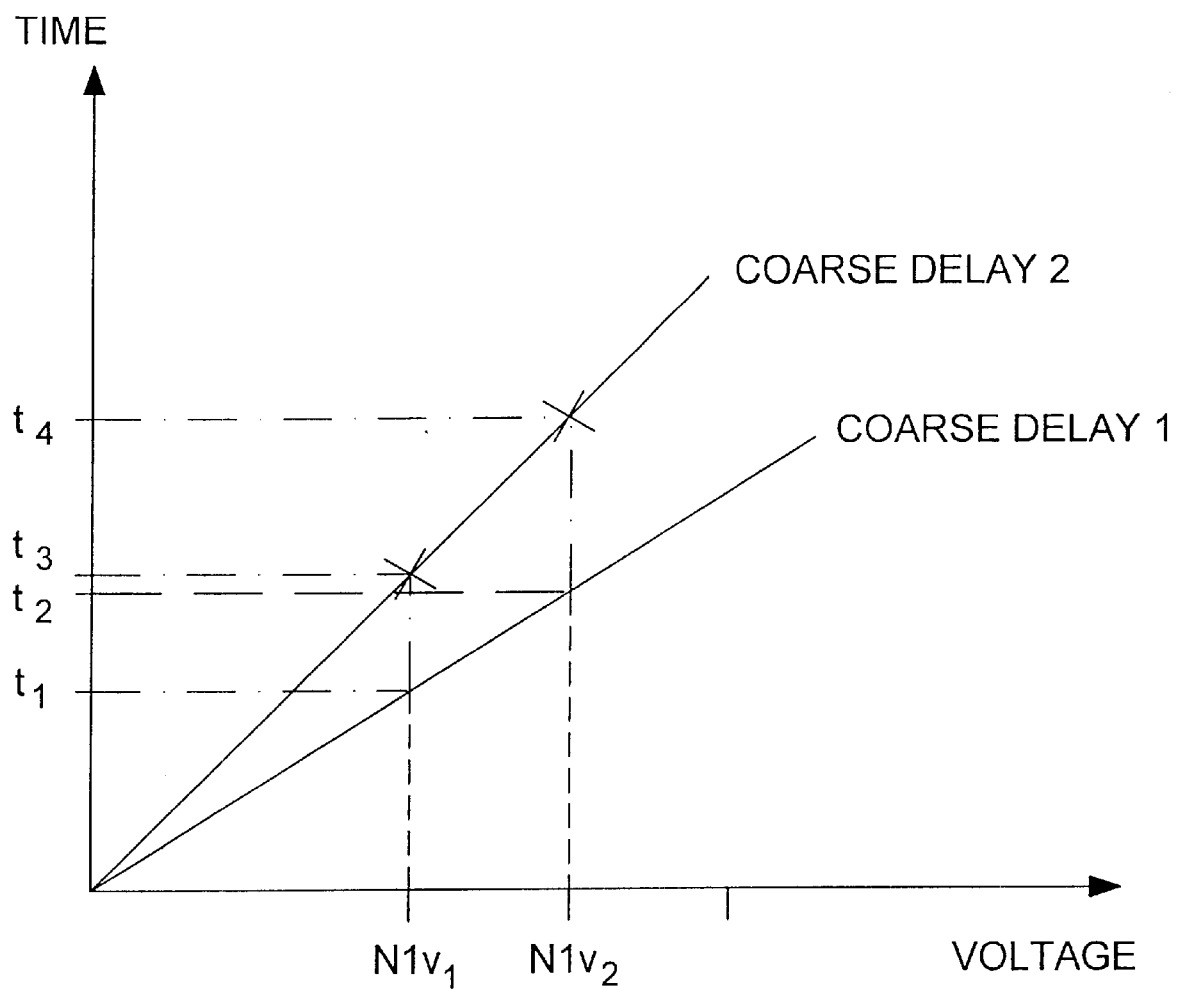
FIG. 2 is a graph used to illustrate how the circuit of FIG. 1 controls delay.

The value of the constant current controls whether the capacitor will charge either faster or slower thereby controlling the slope of the node N1 voltage vs time delay curve shown in FIG. 2. The current source therefore controls the coarse delay characteristic of the delay element.

For example, assuming that the constant current source 103 provides a certain value of current, the capacitor will charge at a particular rate and establish one of the charge rate (slope) curves shown in FIG. 2. When the capacitor discharges due to the input signal to the gate of FET 105 going high and causing FET 105 to conduct, the output to the comparator will go to high logic level. After the input signal goes to low logic level (time $t_a$) the FET 105 switches off, and capacitor 101 will begin to charge. The ramp signal 109 is applied to the noninverting input of the comparator. The output of the comparator 111 remains at low logic level until the ramp voltage reaches the voltage value applied to its other input, $V_T$, at which time its output signal switches to high logic level. The difference in time between the trailing edge of the signal at IN and the time at which the comparator 111 generates a trailing edge to its output signal on node N2 represents the coarse delay time $t_d$.

It may be seen that by controlling the capacitor 101 charging current the time delay $t_d$ can be controlled to a desired coarse delay timing value.

The voltage $V_T$ applied to one of the inputs of comparator 111 controls the operating point on the curve in FIG. 2, and therefore controls the fine delay characteristic of the delay element.

Thus, for a fine delay increase, the voltage causes the delay time to increase from $t_1$ to $t_2$, determined by a charge of the operation point on the slope of the particular coarse delay curve. For a coarse delay increase, the coarse delay curve slope changes the time delay thus charging e.g. from $t_1$ to $t_3$. For both a coarse and fine time delay, both the coarse delay curve slope changes and the operating point on the curve changes the time delay charging from $t_1$ to $t_4$.

Figure 3:
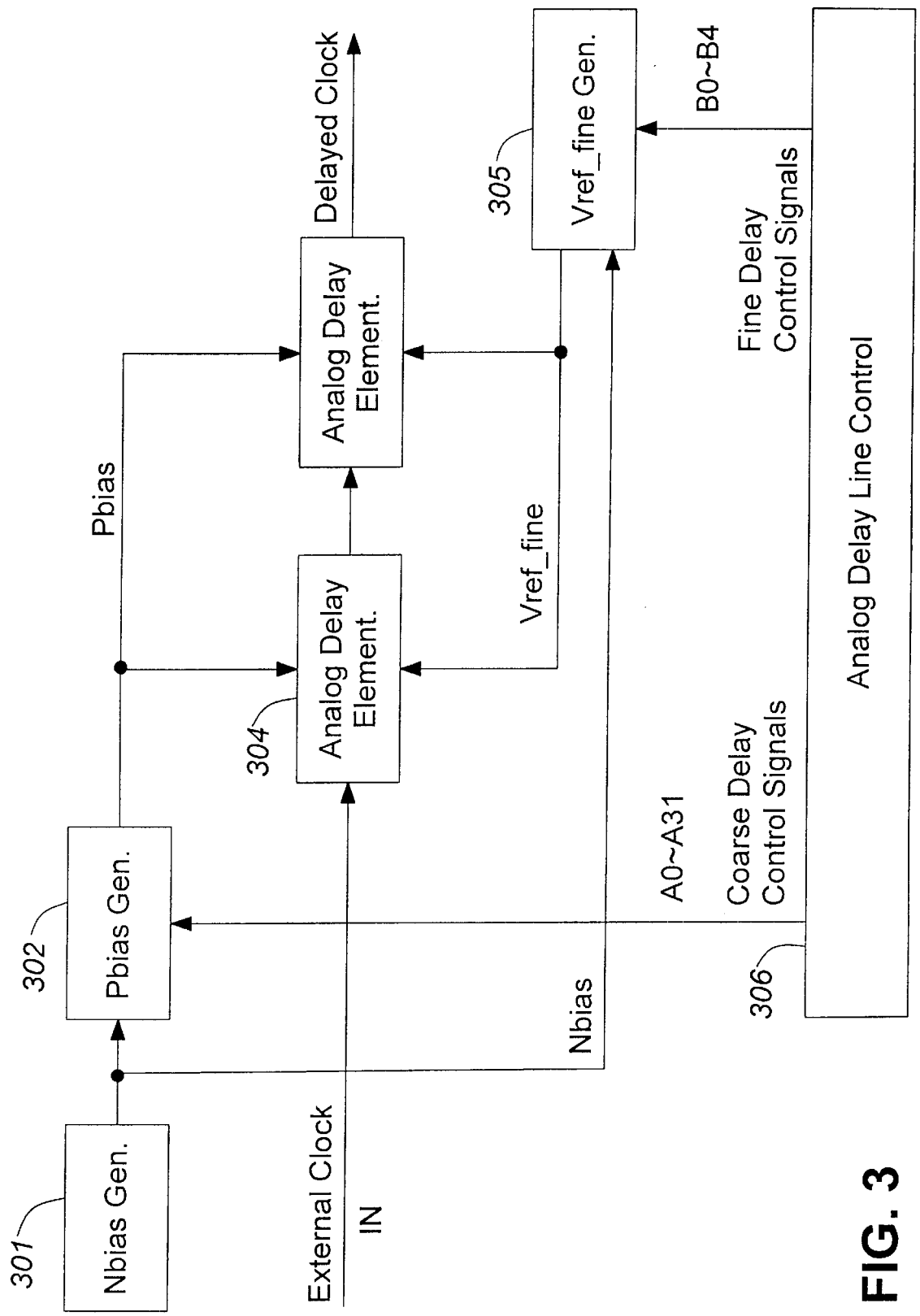
FIG. 3 is a block diagram of a delay line with two analog delay elements constructed in accordance with an embodiment of the present invention.

The basic concept of the analog delay element which was described above can be embodied in a delay circuit, the block diagram of which is shown in FIG. 3. An analog delay element 304 (more than one can be coupled together as shown in FIG. 3, and as will be readily understood by one skilled in the art, a minimum of two delay elements are needed in order to generate an output clock signal having the same duty cycle as the input clock signal. In general an even number of delay elements is needed, although only one has been described here.) has an external clock applied to it at IN, as well as a coarse delay control signal Pbias generated by a Pbias generator 302, and a fine delay control signal Vref_fine generated by a Vref_fine generator 305. The Pbias signal is used to control the constant current value described with reference to FIGS. 1A, 1B and 2, and is thus a coarse delay control signal. The Vref_fine control signal corresponds to the $V_T$ signal applied to the comparator of FIG. 1A, and thus is a fine delay control signal. The delayed external clock signal is shown at the output of the delay elements as Delayed Clock.

An Nbias signal generator 301 is used to provide a bias signal for operation of certain FETs in the Pbias generator 302 and in the Vref_fine generator 305, and will be described in more detail later.

An analog delay line control circuit 306 outputs coarse delay control signals A0–A31 for controlling the Pbias generator, and also outputs fine delay control signals B0–B4 for controlling the Vref_fine generator, as will be described in more detail later.

The analog delay line control responds to externally supplied signals (not shown) which designate e.g. a phase mismatch between an external clock and the delay clock. The internal clock is typically derived from the external clock. As a result the analog delay line control outputs coarse delay control signals which causes the Pbias generator to input a signal to the coarse delay control input of the analog delay element (or coarse delay control inputs of a series of analog delay elements). This causes the delay time of the delay element or elements to be changed as described above.

When the time delay is close to the optimum, the analog delay line control causes the fine delay control signal to adjust to time delay further until the external signal to the analog delay line control to indicate that no further adjustments need be done. In practice, in the event the coarse delay control controls the delay too much, this is indicated by the external signal to the analog delay line control, which backs off the coarse delay to a point at which the fine delay control is used to adjust the delay of the analog delay element or series of elements to the optimum delay.

Figure 4:
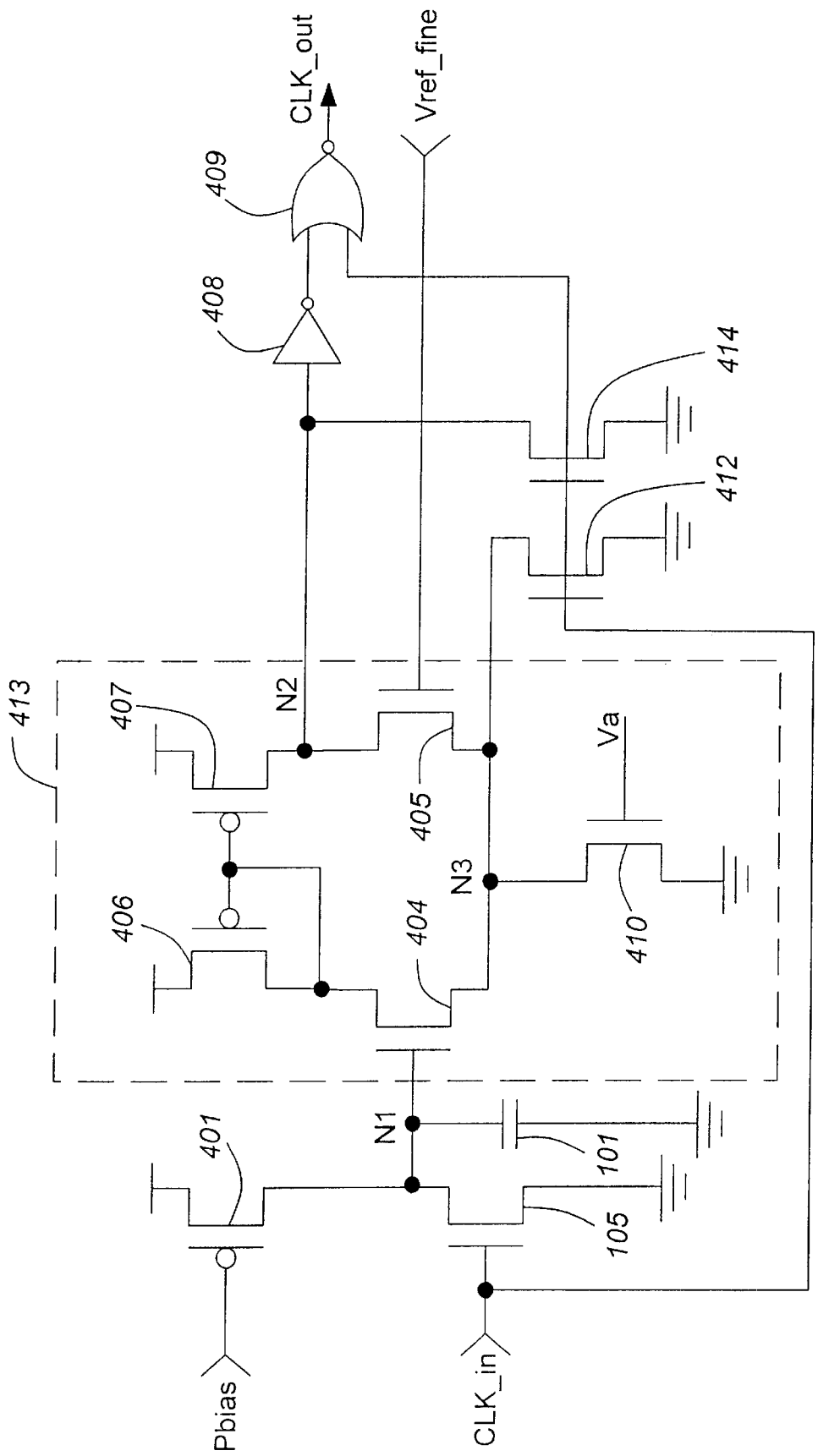
FIG. 4 is a schematic diagram of a delay element constructed in accordance with an embodiment of the present invention.

FIG. 4 is a schematic diagram of a preferred embodiment of the delay element 304. Capacitor 101 is repeated from FIG. 1, as is FET 105. The constant current source 103 is provided by another FET 401. In the preferred embodiment, FET 105 is an n-channel FET, and FET 401 is a p-channel FET.

Node N1 is applied to the input of comparator 413. The comparator is shown specifically as a current mirror amplifier of well known construction formed of FETs 406, 407, 404, 405 and 410. The input to the comparator is at the gate of an FET 404. The junction of FETs 405 and 407 form the comparator output, and the gate of FET 405 forms a second input for the comparator. A bias voltage Va is applied to the gate of FET 410.

The output signal of the comparator, at node N2, is applied to the input of an inverter 408, the output of which is applied to one input of NOR gate 409. The gate of FET 105 receives the CLK_in signal, which signal is also applied to the second input of NOR gate 409, as well as to the gates of pulldown FETs 412 and 414, the first of which has its source-drain circuit connected in parallel to the source-drain circuit of FET 410 and the second of which has its source-drain circuit connected between node N2 and ground.

In operation, the voltage Pbias is applied to FET 401, which causes FET 401 to operate in its saturation region, thus operating effectively as a constant current source with the value of the current being controlled by the value of Pbias. Other controlled current source implementations could be envisaged by persons skilled in the art.

Figure 7:
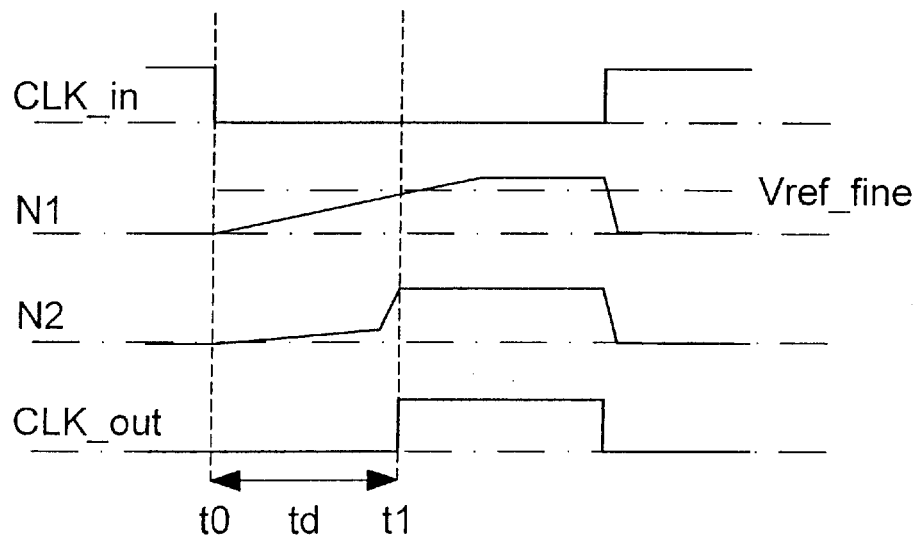
FIG. 7 is a plot illustrating waveforms at various locations of the circuit of FIG. 4 for a particular coarse and fine setting.

With reference also to the timing diagram shown in FIG. 7, for the high logic level portion of the period of the signal CLK_in, the output signal CLK_out is kept at low logic level due to the action of NOR gate 409. The high logic level of the signal CLK_in also causes FET 105 to be conductive, thereby discharging capacitor 101. Node N1 is thus maintained at a low logic level, as shown in FIG. 7. The amount of constant current flowing through FETs 401 and 105 to ground from the power supply is controlled by the voltage Pbias. However, with CLK_in being at low logic level, substantially no current flows through FET 105.

The high logic level voltage applied to FET 414 causes it to conduct, bringing the input of inverter 408 to ground, and the other input to NOR gate 409 to high logic level. The output of the NOR gate is thus at low logic level. The high logic level voltage applied to the gate of FET 412 causes it to conduct, bringing the node N3 to ground, and thereby disabling the comparator 413.

At the time t0 shown in FIG. 7 the falling edge of CLK_in is applied to the gate of FET 105. As a result, FET 105 ceases conducting, and capacitor 101 begins charging. A ramp voltage will develop at node N1 as shown in FIG. 7, which will surpass the threshold voltage Vref_fine after a time delay $t_d$, where $t_d=t_1-t_0$. The ratio W/L of the gate width W of the FET 105 to the channel length L of FET 105 should be considerably larger than W/L of FET 401, so that the voltage between the gate and the source of FET 105 is larger than that of FET 401. It should be noted that although the system is described above with respect to the falling edge of CLK_in, a dual system could be implemented which responds to the rising edge of CLK_in.

With the CLK_in signal going to low logic level, FET 412 is disabled, allowing FET 410, having reference voltage Va applied to its gate, to become operative, thereby activating the comparator. FET 414 is also disabled, allowing the output signal on node N2 to determine the input to inverter 408.

With the fine control voltage Vref_fine applied to the gate of FET 405, when the voltage at the node N1 reaches and surpasses the Vref_fine level, the comparator 413 conducts more current through the FET branch 406, 404, 410, thereby allowing the voltage at the N2 node to change from low to high logic level, as shown by curve N2 in FIG. 7. This occurs at time t1. Thus the falling edge of the CLK_in voltage is delayed from time t0 to the time t1 by the time td. This voltage is inverted in inverter 408, so that the voltage applied to the NOR gate 409 is the same polarity as that of the CLK_in signal. Note that the output of inverter 408 does not switch until N2 reaches its switching point at time $t_1$. Effectively, inverter 408 transforms the still analog signal at node N2 into a crisp digital output of CLK_out.

When the CLK_in signal again reverts to high logic level, FETs 105, 412 and 414 are enabled, discharging capacitor 101 (bringing node N1 to ground), disabling the comparator 413, bringing node N2 to ground, and causing the output of NOR gate 409 to go to low logic level. As the CLK_in signal operates at its particular given frequency, the generation of the ramp voltages at under N1 and N2, resulting in the delayed output CLK_out are repeated for every cycle. It is important to note that the delay $t_d$ by which the output signal CLK_out is delayed is determined by the two control voltages Pbias, determining the coarse delay, and by Vref_fine, determining the fine delay. The use of the current mirror comparator allows for the accurate customized control of the delay $t_d$ based on the control voltage levels Pbias and Vref_fine.

Figure 5:
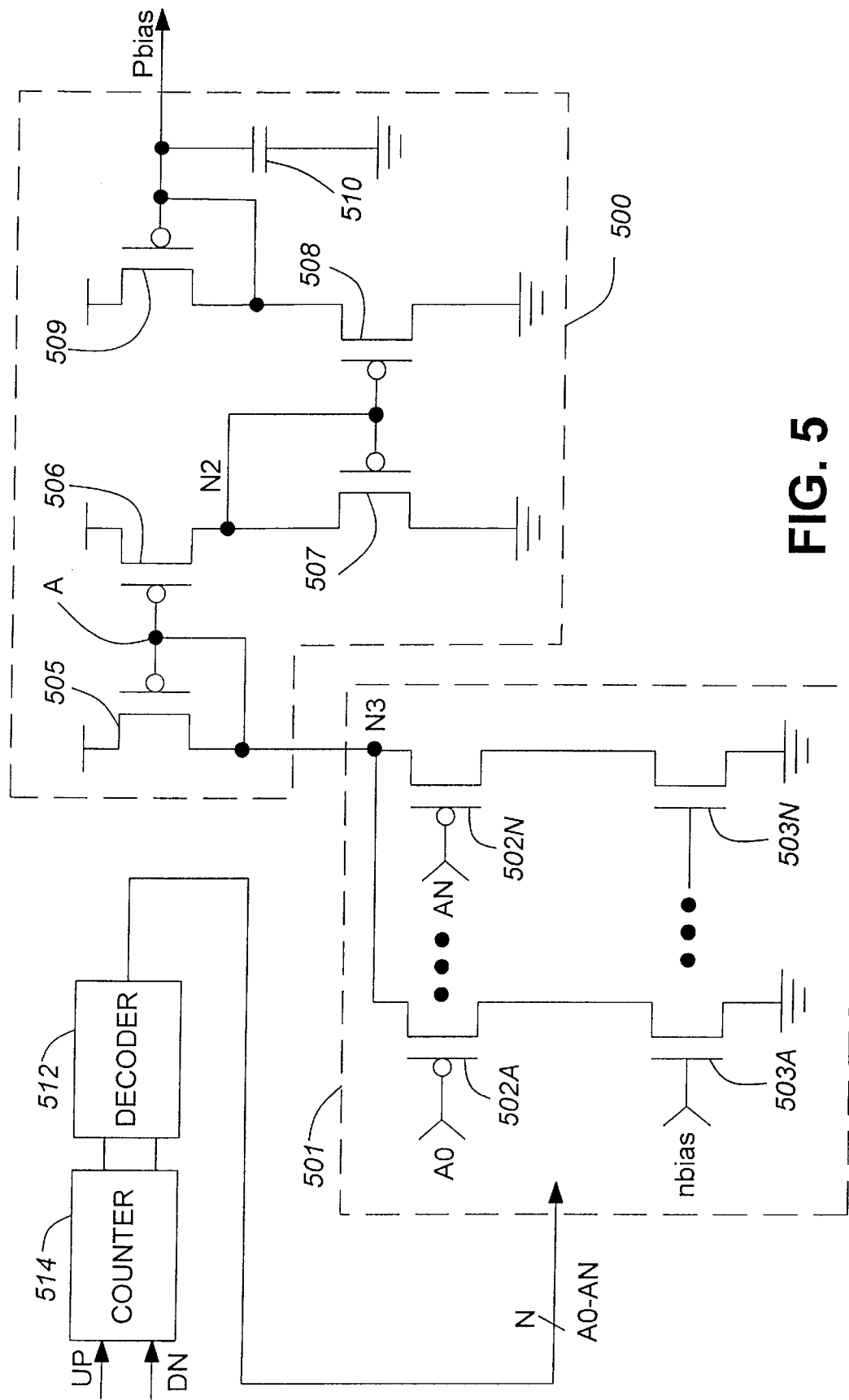
FIG. 5 is a schematic diagram of a coarse delay control signal generating circuit in accordance with an embodiment of the present invention.

FIG. 5 is a schematic diagram of a preferred form of a coarse delay control circuit and Pbias signal generator. This is comprised of a current mirror circuit 500, a current control circuit 501 and a capacitor 510. The current mirror circuit is comprised of a cascade of three current mirrors connected between a positive power supply rail and ground, formed of PMOS FETs 505 and 506, NMOS FETs 507 and 508, and PMOS FET 509. Capacitor 510 is connected between the output of FET 509 and ground. The control voltage Pbias is obtained from the output of FET 509.

The current control circuit 501 is comprised of plural pulldown circuits connected in parallel, each formed of two NMOS FETs 502A and 503A–502N and 503N. The source-drain circuits of each pair of FETs are connected in series between the node N3 and ground, and node N3 is connected to the positive power rail through a PMOS FET 505. Decoded select logic signals A0–AN are applied to one or more of the gates of FETs 502A–502N, and a bias voltage nbias is applied to the gates of FETs 503A–503N.

The sizes of FETs 503A–503N are selectively different from each other so that with a common nbias voltage applied to their gates, the FETs provide different resistances. The sizes of FETs 502A–502N should be such that they all provide minimal resistance, and with an enabling voltage applied to their gates, they act as switches. The overall sizes should be such that the currents, passing from the positive voltage rail (VDD) to ground via FET 505, the switches formed by FETs 502A–502N through respective FETs 503A–503N, should vary (increase) linearly through successive paths through FETs 503A–503N. In a preferred embodiment, there were 32 pairs of FETs 502 and 503. The reference voltage nbias was received from a conventional DC reference voltage generator (not shown).

The signals A0–AN can be derived from a decoder 512 which decodes a signal provided by a counter (e.g. a 5 bit counter 514 for AN=32). The counter receives up and down (UP/DN) control signals from the delay line control 306 (FIG. 3) which compares the phase of a feedback clock signal with the external (clock) signal and generates the UP and DN signals in a well known manner.

In operation, because the gate bias nbias is a constant DC voltage, the gate biases of the NMOS FETs 503A–503N are constant. The currents passing through these FETs are determined by their sizes. The gates of FETs 502A–502N receive the coarse delay control signal A0–AN referred to with reference to FIG. 3. One (or more, if necessary) of FETs 502A–502N are switched on, which causes one (or more) of FETs 503A–503N to be connected between the node N3 and ground. As an example, if only one of the A0–AN control signals is activated, then a constant current controlled by the size of a corresponding one of FETs 503A–503N passes from the positive voltage rail, through PMOS 505 to node N3 and through one of FETs 502A–502N activated by the A0–An control signal, and a corresponding one of FETs 503A–503N to ground. Depending on the ratios of FETs 505, 506, 507, 508 and 509 in FIG. 5 and FET 401 shown in FIG. 4, a constant current is supplied to the node N1 of the circuit of FIG. 4. As a result, the ramp slope of the node N1 is determined. In effect, this ramp slope is determined by the control signals A0–AN.

Figure 8:
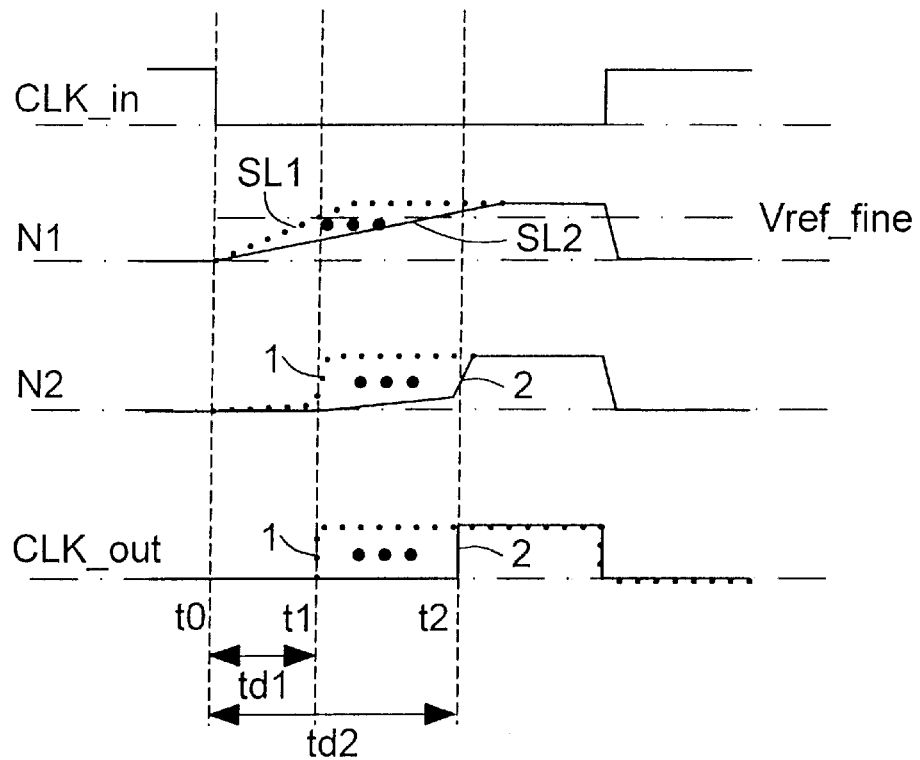
FIG. 8 is a plot illustrating waveforms at various locations of the circuit of FIG. 4, showing two different coarse delay settings.

The ramp slope at node N1 also affects the ramp slope at the N2 node, as shown in FIG. 8. FIG. 8 is similar to FIG. 7 with more detail added, and in particular illustrates the effect of varying the ramp slope at node N1 with coarse control. In FIG. 8, the dotted line SL1 shows the steeper slope of the signal at node N1 when the effective resistance of one of FETs 503A–503N is smaller (a greater constant current), and the shallower slope when the effective resistance of one of FETs 503A–503N is larger (a smaller constant current).

The number of FETs 503A–503N (and corresponding FETs 502A–502N and control signals A0–AN) to be used in the circuit will be determined by the required resolution and amount of coarse delay. More than one FET 503A–503N can be switched in parallel to provide different resistances in order to cause a particular slope which may be intermediate or steeper than those that may be provided by switching only a single current path (a single pair of FETs 502 and 503).

Figure 6:
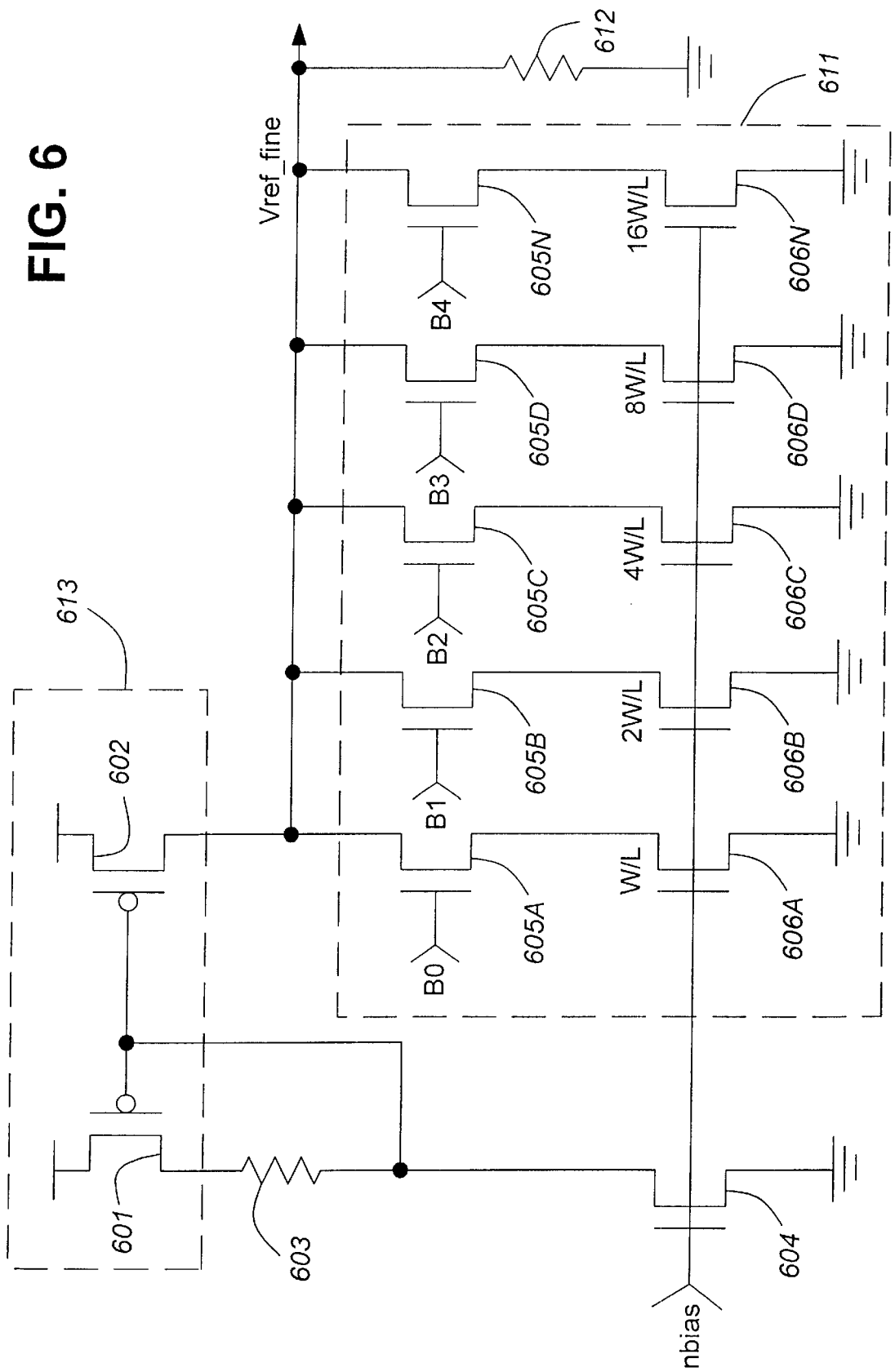
FIG. 6 is a schematic diagram of a fine delay control signal generating circuit in accordance with an embodiment of the present invention.

The fine delay control voltage Vref_fine is preferably generated in a circuit such as is shown in FIG. 6. A current control circuit 611 is formed similarly to that of current control circuit 501 in FIG. 5, except as described below. In the present case, the serially connected FET pairs are 605A and 605N–606A and 606N, the drains of FETs 606 being connected to the sources of FETs 605. The sizes of FETs 606A–606N are preferably binary weighted; in a preferred embodiment 5 bits being used so as to provide 32 steps. Thus the width to length ratio of these FETs (W/L) of FET 606A was 1, the next was 2W/L, the next was 4W/L, the next was 8W/L and the last of the 5 was 16W/L. The bias voltage nbias is applied to the gates of FETs 606A–606N.

Fine delay control voltages B0–BN are applied to one or more of the gates of switch FETs 605A–605N.

Current mirror 613 is comprised of PMOS FETs 601 and 602 and has a pulldown path through resistor 603 and NMOS FET 604. The output of the current mirror provides the output signal Vref_fine. The level of Vref_fine is controlled by the bias current control circuitry 611, which sets the current flowing from the output of the current mirror to ground. The bias current control circuit 611 is formed of a plurality of series connected to FETs 605A and 606A–606A and 606N, each series pair being connected in parallel between the output carrying the signal Vref and ground, as shown in FIG. 6. A resistor 612 is also connected in parallel with the series pairs to provide a load to the output of the current mirror when none of the FETs in 611 are enabled.

In operation, a constant current passes from the positive voltage rail, through FET 601, resistor 603 and FET 604. Due to the current mirror action, a proportional constant current flows from the positive voltage rail, through FET 602 and the control circuit 611 according to the size ratio between FETs 601 and 602. The FETs 606A–606N function as binary-weighted resistors. Upon enabling of one or more FETs 605A–605N by the control signals B0–BN, the constant current flowing through FET 602 is conducted through one or more corresponding FETs 606A–606N from the positive voltage rail. The voltage Vref_fine at the output is determined by the ratio of the resistances of FET 602 and the single or parallel resistances of FETs 606A–606N, times the voltage at the positive voltage rail, e.g. VDD.

Thus in the 5-bit example shown in FIG. 6, the voltage Vref_fine can have 32 different levels by the 5 bit binary combination of the B0–B4 control signals. The control signals B0–B4 (or BN) can be generated in a manner similar to control signals A0–AN, using a counter and decoder in delay line control 306, the counter being driven by UP/DN signals from a comparison of the phase of the feedback clock with that of the external (input) signal.

Figure 9:
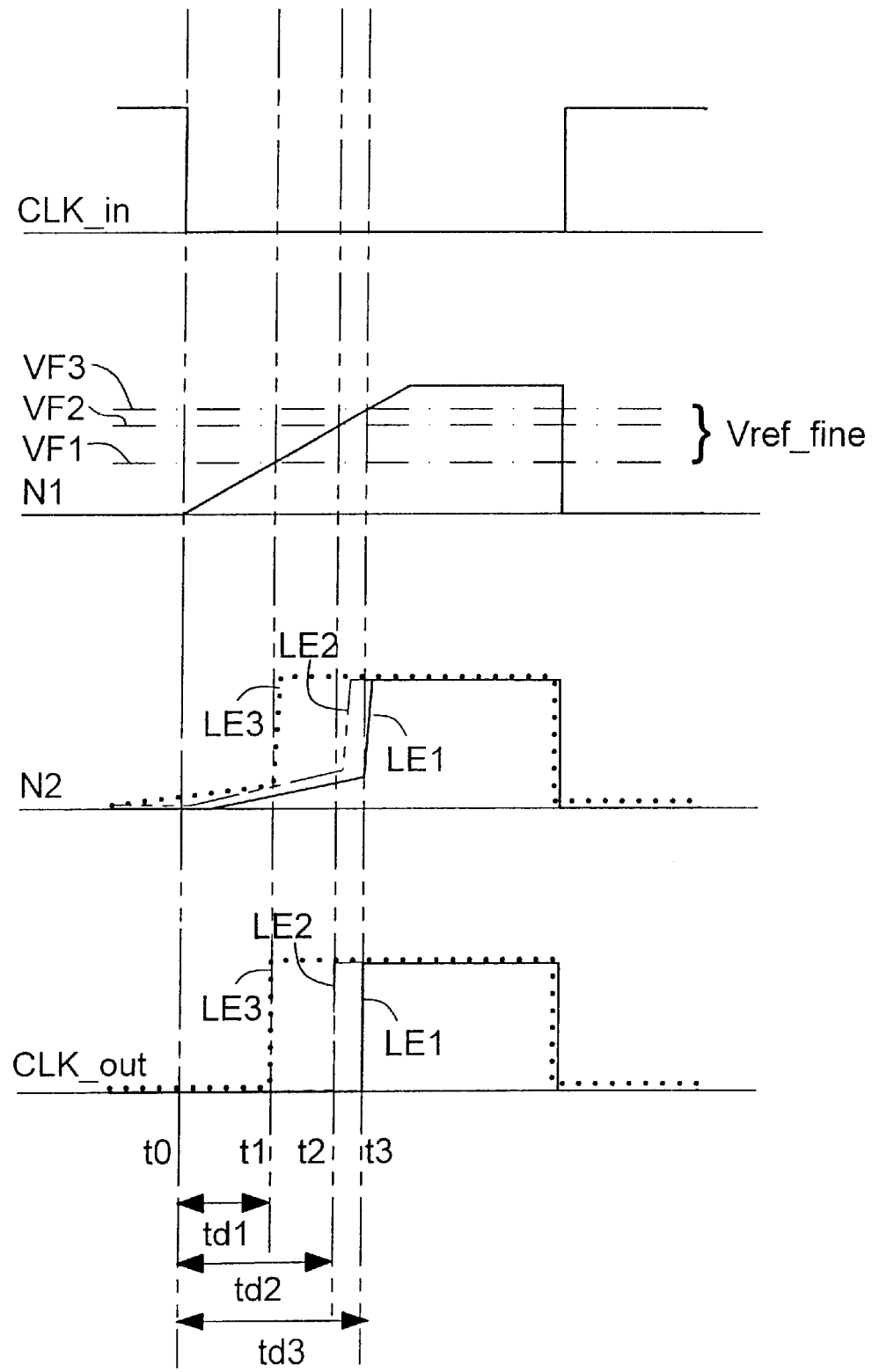
FIG. 9 is a plot illustrating waveforms at various locations of the circuit of FIG. 4, for different fine delay settings.

FIG. 9 illustrates the enlarged voltage curves of FIGS. 7 and 8, with the effect of variation of the fine delay control voltage Vref_fine. As previously noted, at node N1, a particular ramp slope is determined by a particular coarse control signal A0–AN. To illustrate the effects of varying the fine delay, superimposed on this curve are three values of Vref_fine, VF1, VF2 and VF3. The intersections of VF3, VF2 and VF1 with the ramp constitutes delay operating points t3, t2 and t1 of the circuit (shown on the CLK_out curve), which provide delays td3, td2 and td1 respectively.

The corresponding timing of the signal at node N2 is also shown, with the rising edges at LE1, LE2 and LE3 respectively. The respective rising edges of different time delayed output clock signals are also shown as LE1, LE2 and LE3 in the curve CLK_out.

Thus the coarse delay signal Pbias applied to FET 401 of the delay element or series of elements (FIGS. 3 and 4), which varies the slope of the ramp at the node N1 (FIG. 4), is controlled by the signals A0–AN, and the fine delay signal Vref_fine applied to FET 405 in comparator 413 (FIG. 4) which varies the operating point on the slope of the ramp, combine to vary the time delay in the analog delay element or elements to a wide degree, avoiding the problems encountered with the prior art structures described earlier.

The above has thus described a system which controls a digital clock signal by means of variable analog delay elements, to produce a digital output clock signal with controllable delay.

While the description of the preferred embodiment described above has indicated the use of particular conductivity types of FETs for various purposes and a power supply having the positive polarity and ground, it will be recognized that opposite conductivity FETs can be used instead, with a corresponding change in the polarity of the power supply, within the scope of the invention.

A person understanding this invention may now conceive of alternate embodiments and enhancements using the principles described herein. All such embodiments and enhancements are considered to be within the spirit and scope of this invention as defined in the claims appended hereto.

We claim:

1. A delay line for receiving an input clock signal and internally delaying the input clock signal to produce an output clock signal, the delay line comprising:

a plurality of analog delay elements, each analog delay element comprising a comparator and also having a first delay adjustment input and a second delay adjustment input;

a first bias voltage generator for providing a first bias voltage to the first delay adjustment input of each analog delay element;

a second bias voltage generator for providing a second bias voltage to the second delay adjustment input of each analog delay element;

a third bias voltage generator for providing a third bias voltage as an input to both the first and second bias voltage generators; and a delay line control circuit for controlling the first and second voltage bias generators for selectively adjusting the delay time of the delay elements.

2. A delay line as defined in claim 1 wherein said comparator comprises a current mirror amplifier.

3. A delay line as defined in claim 1, wherein said analog delay element further comprises an amplifier.

4. A delay line as defined in claim 1, wherein said analog delay element further comprises a current mirror amplifier.

5. A delay line as defined in claim 1, wherein said analog delay element further comprises:

a field effect transistor connected to a first node, said field effect transistor having means for receiving the input clock signal;

a capacitor connected to a first node, said capacitor being capable of charging while the field effect transistor is nonconductive;

a constant current source connected in series with the capacitor at the first node, the current source providing current to said capacitor; and a comparator connected to the first node, the comparator having means for receiving an output voltage at the first node and means for comparing the output voltage to a reference voltage.

* * * * *